United States Patent
Fan et al.

(10) Patent No.: US 9,547,747 B2
(45) Date of Patent: Jan. 17, 2017

(54) DISTRIBUTED INTERNET PROTOCOL NETWORK ANALYSIS MODEL WITH REAL TIME RESPONSE PERFORMANCE

(71) Applicant: Futurewei Technologies, Inc., Plano, TX (US)

(72) Inventors: John Fan, Fremont, CA (US); Chuhyu Lin, San Jose, CA (US); Ronald Chu, Palo Alto, CA (US); George Weigt, Santa Clara, CA (US); Fangli Chien, San Jose, CA (US)

(73) Assignee: Futurewei Technologies, Inc., Plano, TX (US)

(*) Notice: Subject to any disclaimer, the term of this patent is extended or adjusted under 35 U.S.C. 154(b) by 980 days.

(21) Appl. No.: 13/708,957

(22) Filed: Dec. 8, 2012

(65) Prior Publication Data

US 2013/0166260 A1 Jun. 27, 2013

Related U.S. Application Data

(60) Provisional application No. 61/568,467, filed on Dec. 8, 2011.

(51) Int. Cl.
| | |
|---|---|
| *G06F 7/60* | (2006.01) |
| *G06F 17/10* | (2006.01) |
| *G06F 17/50* | (2006.01) |
| *G06F 9/44* | (2006.01) |
| *H04L 12/24* | (2006.01) |

(52) U.S. Cl.
CPC .............. *G06F 17/509* (2013.01); *G06F 8/35* (2013.01); *H04L 41/145* (2013.01); *H04L 41/0823* (2013.01)

(58) Field of Classification Search
CPC ...... G06F 17/509; G06F 8/35; H04L 41/0823; H04L 41/145
USPC ............................................................. 703/2
See application file for complete search history.

(56) References Cited

U.S. PATENT DOCUMENTS

| | | | |
|---|---|---|---|
| 6,992,975 B1 * | 1/2006 | Daniel ................ | H04L 41/0681 370/221 |
| 2002/0198995 A1 * | 12/2002 | Liu .......................... | H04L 29/06 709/226 |

(Continued)

FOREIGN PATENT DOCUMENTS

WO    2006130667 A2    12/2006

OTHER PUBLICATIONS

Foreign Communication From a Counterpart Application, European Application No. 12806798.0, Extended European Search Report dated Aug. 26, 2015, 11 pages.

(Continued)

*Primary Examiner* — Aniss Chad
(74) *Attorney, Agent, or Firm* — Conley Rose, P.C.

(57) ABSTRACT

A system for generating a network analysis model is provided. The system comprises a text-based model definition file representing analysis flow and a hierarchical analysis tree; an analysis function block library comprising a plurality of analysis nodes in an analysis model definition, wherein each of the analysis nodes comprises at least one reusable analysis block; and a code generator that automatically generates code to implement the analysis model from the analysis function block library by parsing the model definition file.

14 Claims, 9 Drawing Sheets

(56) References Cited

U.S. PATENT DOCUMENTS

| | | | |
|---|---|---|---|
| 2004/0243338 A1* | 12/2004 | Sabiers | G06F 11/3495 |
| | | | 702/122 |
| 2005/0049924 A1 | 3/2005 | DeBettencourt et al. | |
| 2005/0278692 A1* | 12/2005 | Sridhar | G06F 8/20 |
| | | | 717/106 |
| 2006/0047618 A1* | 3/2006 | Bannach | H04L 41/0213 |
| 2008/0126397 A1* | 5/2008 | Alexander | G06F 17/30595 |
| 2008/0225710 A1* | 9/2008 | Raja | G06F 9/505 |
| | | | 370/230.1 |
| 2009/0216510 A1* | 8/2009 | Higashino | H04W 24/06 |
| | | | 703/13 |
| 2009/0222782 A1 | 9/2009 | Bayati et al. | |
| 2009/0265681 A1* | 10/2009 | Beto | G06F 11/3688 |
| | | | 717/100 |
| 2011/0145286 A1 | 6/2011 | LaRowe et al. | |
| 2012/0239799 A1 | 9/2012 | Wang et al. | |

OTHER PUBLICATIONS

Foreign Communication from a Counterpart Application, PCT Application No. PCT/US2012/068641, Invitation to Pay Additional Fees dated Aug. 6, 2013, 6 pages.

"Distributed Network Analysis," WildPackets, www.wildpackets.com, Brochure, 2012, 3 pages.

Foreign Communication From a Counterpart Application, PCT Application No. PCT/US2012/068641, International Search Report dated Oct. 28, 2013, 6 pages.

Foreign Communication From a Counterpart Application, PCT Application No. PCT/US2012/068641, Written Opinion dated Oct. 28, 2013, 10 pages.

* cited by examiner

DISTRIBUTED INTERNET PROTOCOL NETWORK ANALYSIS MODEL WITH REAL TIME RESPONSE PERFORMANCE

CROSS-REFERENCE TO RELATED APPLICATIONS

The present application claims priority to U.S. Provisional Patent Application No. 61/568,467 filed Dec. 8, 2011 by John Fan, et al. and entitled "Distributed Internet Protocol Network Analysis Model with Real Time Response Performance", which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Operations Support Systems (OSS) and similar computer systems have been developed to analyze networks such as telecommunications networks and internet protocol (IP) networks. The analysis may involve the monitoring of network traffic, the configuration of network components, the discovery and management of faults in the network, and similar activities. Numerous automated network analysis tools are available for performing such activities, such as packet analyzers, port scanners, hardware scanners, and similar equipment.

SUMMARY

In one embodiment, the disclosure includes a system for generating a network analysis model. The system comprises a text-based model definition file representing analysis flow and a hierarchical analysis tree; an analysis function block library comprising a plurality of analysis nodes in an analysis model definition, wherein each of the analysis nodes comprises at least one reusable analysis block; and a code generator that automatically generates code to implement the analysis model from the analysis function block library by parsing the model definition file.

In another embodiment, the disclosure includes a method for defining performance of a network analysis model. The method comprises defining the performance of the network analysis model according to the formula:

$$\text{ANALYSIS\_MODEL\_PERFORMANCE} = \text{MAX\_CODE\_LINES\_PER\_NODE} \times \text{MAX\_TREE\_DEPTH} \times \text{AVERAGE\_EXE\_TIME\_PER\_LINE}$$

where ANALYSIS_MODEL_PERFORMANCE is the network analysis model performance and is defined to meet a real time performance target, MAX_CODE_LINES_PER_NODE is the maximum number lines of code in an analysis node and is predefined, and MAX_TREE_DEPTH is the depth of the network analysis model and is defined to meet the network analysis model performance.

In yet another embodiment, the disclosure includes an apparatus for executing a network analysis model comprising a processor and a memory coupled to the processor, wherein the memory comprises instructions that, cause the processor to execute the network analysis model on a distributed platform, wherein the distributed platform includes a flow-based load balancer to distribute data flow to multiple analysis nodes, and wherein the analysis nodes are unified analysis nodes organized as a hierarchical tree.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Existing model designs for IP network analysis typically consider only logic flow. That is, there are no specific performance requirements in each step of analysis, and detailed performance requirements may be missing when a model is designed. Also, there may be no specific execution requirements. That is, the rules of execution may not be defined, and distributed execution may not be embedded in design methodology. In addition, existing IP network analysis modeling does not support real time response. That is, there is no specific target real time response time, no maximum target response time for a model as a whole, and no guarantee of a response time for each specific analysis path. Also, there is no hardware consideration in existing software modeling design. In general, existing network analysis model designs are based On flow charts and consider only analysis logic in the model. There is no guaranteed performance number and no software and hardware integration. Real time response is not supported, and system resources arc not utilized in an optimal way.

Embodiments of the present disclosure provide a distributed IP network analysis modeling system capable of completing multiple complex analysis models in real time. The total analysis time may be controlled within a small range to achieve real time analysis. An object-oriented model design methodology with specific performance requirements is provided. Analysis is achieved through the use of analysis blocks with distributed execution paths. Dynamic distributed analysis may be performed based on real time resource availability. Also, a predefined constant real time response in a model is provided. In addition, hardware is integrated into software modeling.

The network analysis modeling system disclosed herein includes three areas: an analysis model, models with real time performance, and distributed model execution. Each of these areas will now he considered in turn.

Figure 1:
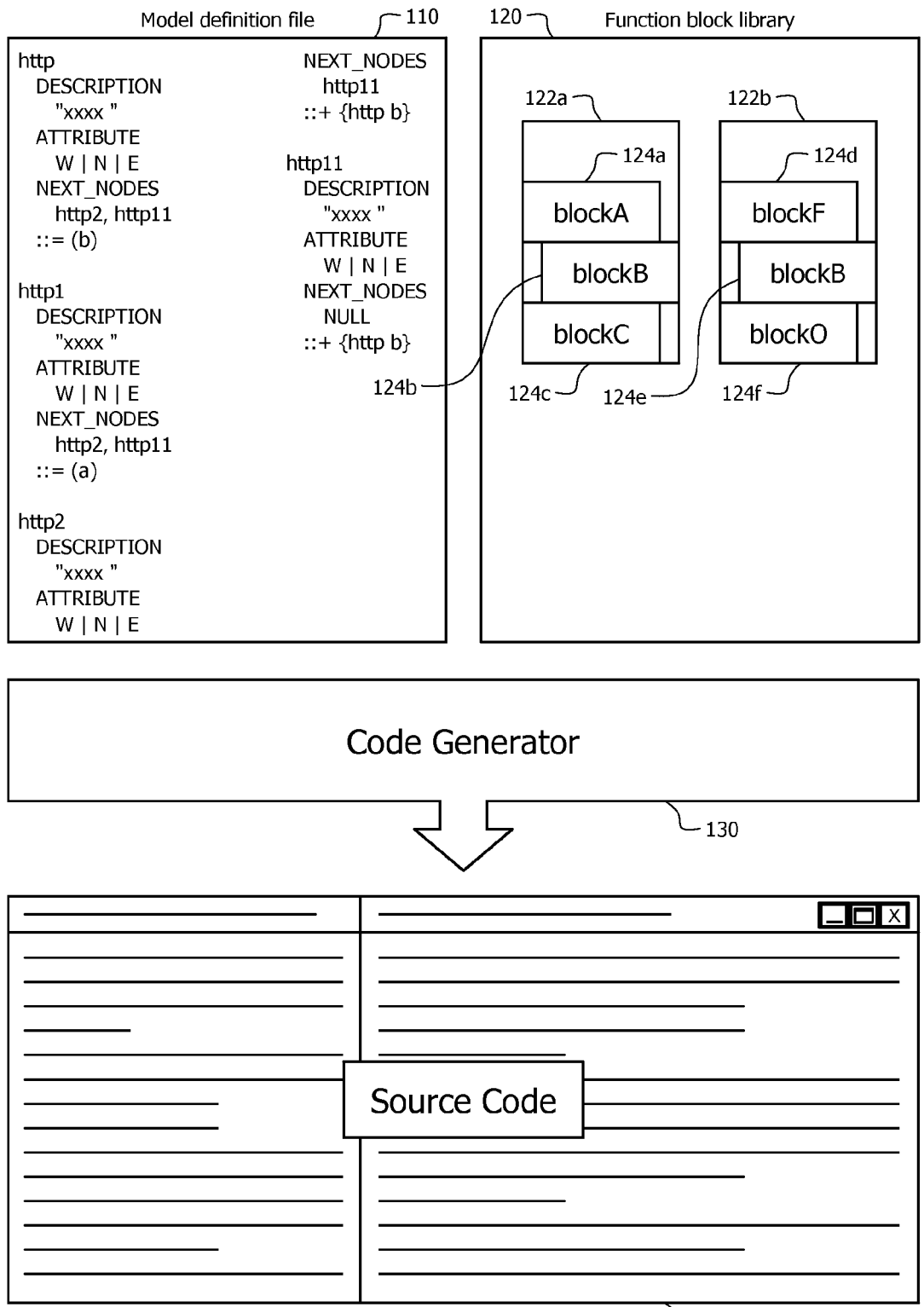
FIG. 1 is a diagram of components in an analysis framework model.

As shown in FIG. 1, there are three components in the analysis model framework, a model definition file 110, an analysis function block library 120, and a code generator 130. The model definition file 110 is a text definition file that defines an analysis model and represents analysis flow and its hierarchical analysis tree. A layer 7 to layer 1 IP network analysis or diagnostic model may be defined in the text file 110. The hierarchical tree may be stored in memory using a binary tree indexed with variable length keys as discussed in conjunction with FIG. 3.

The analysis function block library 120 may include a plurality of reusable analysis nodes 122 in a model definition. Each analysis node 122 may be associated with a set of attributes including execution time and memory requirements. Each analysis node 122 may be identified by a unique analysis node identifier (ID). The node ID may be a string-based ID using character sets from a to z, 1 to 9, and A to Z. The node ID's path from the root to the node may be the analysis node's ID as well as its key. The maximum key length may he the depth of the tree. These concepts are discussed below with regards to FIG. 3.

A model may be composed of a number of unified analysis nodes 122 organized as a hierarchical tree. The analysis nodes 122 may be referred to as unified since the number of lines of code in each analysis node 122 is predefined, the inputs and outputs of each analysis node 122 are similar, and the analysis nodes 122 are all driven by a generic state machine.

Each analysis node 122 may consist of one or more reusable analysis blocks 124. Each analysis block 124 may be associated with a set of attributes including lines of code, average execution time for one line of code on certain predefined hardware, memory requirements, and access to any input/output (I/O). To support different types of I/O, each specific type of I/O may be implemented in one particular analysis I/O block.

The code to implement a model is automatically generated by the code generator 130 from the model definition file 110 and the analysis function block library 120. That is, the code generator 130 generates analysis model source code 140 from the analysis function block library 120 by parsing the model definition file 110. When code 140 is auto-generated by the code generator 130, the model framework is complete.

During system initialization, an analysis model tree is created by auto-generated initialization functions. To start an analysis model, the processing entry point uses the first node's node ID to locate the starting node, and processing may be started from there. In addition, at each analysis node 122, a direct jump to another analysis node 122 may he added to distribute execution to a different central processing unit (CPU) core or a different target machine.

A generic state machine may be used to drive a hierarchical tree to dynamically choose the next analysis node. Below is an example of pseudo code for a generic state machine that may drive the model. The pseudo code represents a node-generic finite state machine (FSM) template in which the node's name is variable and may be replaced with the real node name by the automatic code generator 130 after the node's definition is complete.

```
<%=fsm_func_description%>
void
fsm_func_<%=name %> (struct fsm_node *ptr, <%=aug %>)
{
    int state;
    If (ptr->func) {
        state = ptr->func(<%=aug %>);
    } else {
        /* No function defined, return undefined state */
        return;
    }
    if (state < MAX_NUM_NEXT_STATE) {
        If (ptr->next[state]) {
            Ptr->next[state](<%=aug %>);
        } else {
            /* TODO: no next function defined, add error handling here */
            exit(1);
        }
    } else {
        /* TODO: state undefined, add error handling here */
        exit(1);
    }
}
```

Figure 2:
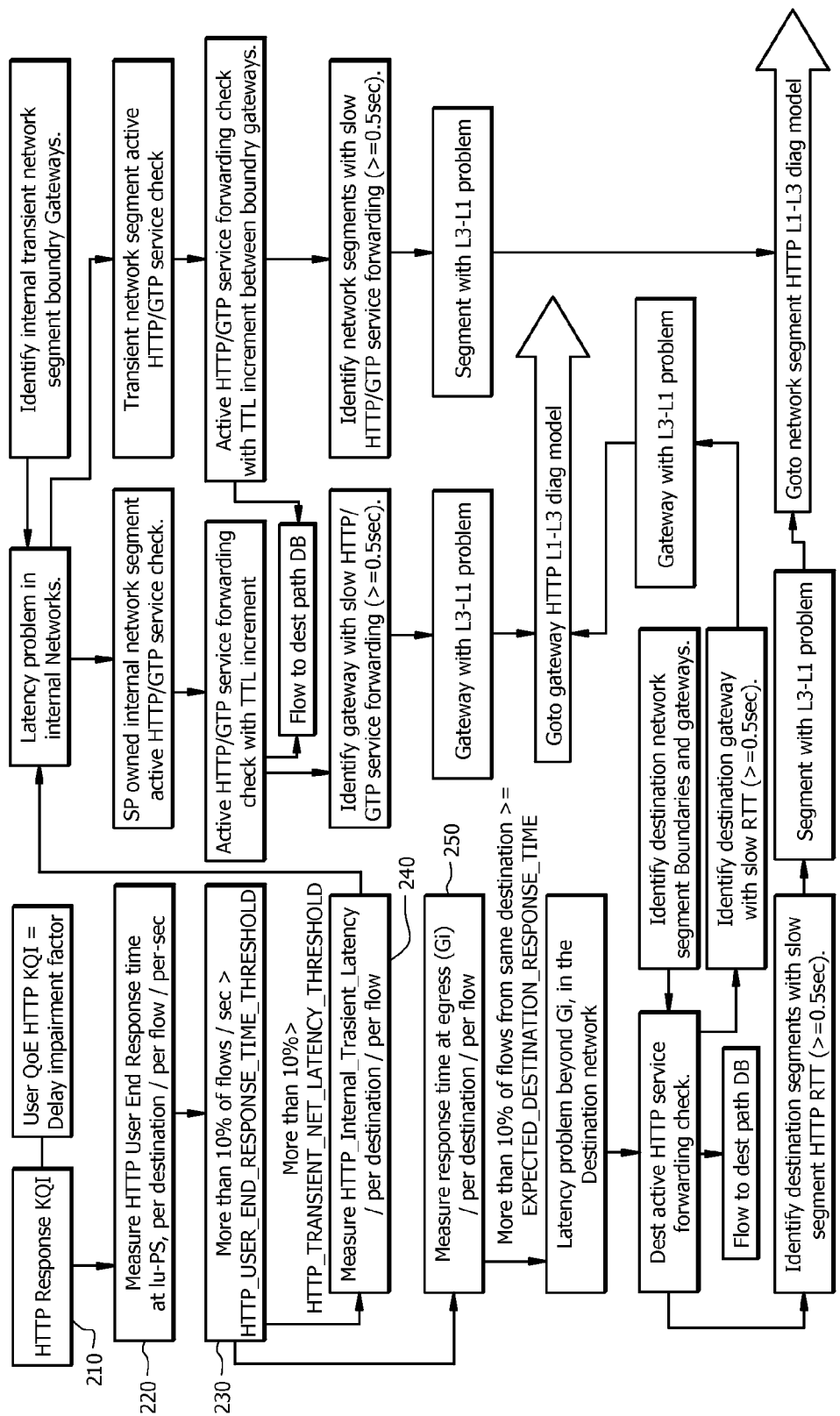
FIG. 2 is a diagram of an analysis model from an engineering perspective.

FIG. 2 illustrates an example of an analysis model that may be implemented based on the embodiments disclosed herein. Specifically, FIG. 2 is a hypertext transfer protocol (http) layer 7 (L7) to layer 4 (L4) quality of experience (QoE) model. Each of the boxes in the figure may represent an analysis block or an analysis node. In this example, an http response key quality indicator (KQI) is determined, as indicated at box 210. At box 220, an http user end response time is measured at the IuPS interface, per destination, per flow, per second. Then, at box 230 it is determined whether more than 10% of the flows per second are greater than the http user end response time threshold. It will be appreciated that metrics other than 10% may be used. If the determination at box 230 is positive, then at box 240 an http internal transient latency per destination, per flow is measured. If the determination at box 230 is negative, then at box 250 a response time at egress (the Gi interface) per destination, per flow is measured. Additional procedures in the analysis model may be discerned from the drawing. The remaining flow proceeds as described in FIG. 3.

Figure 3:
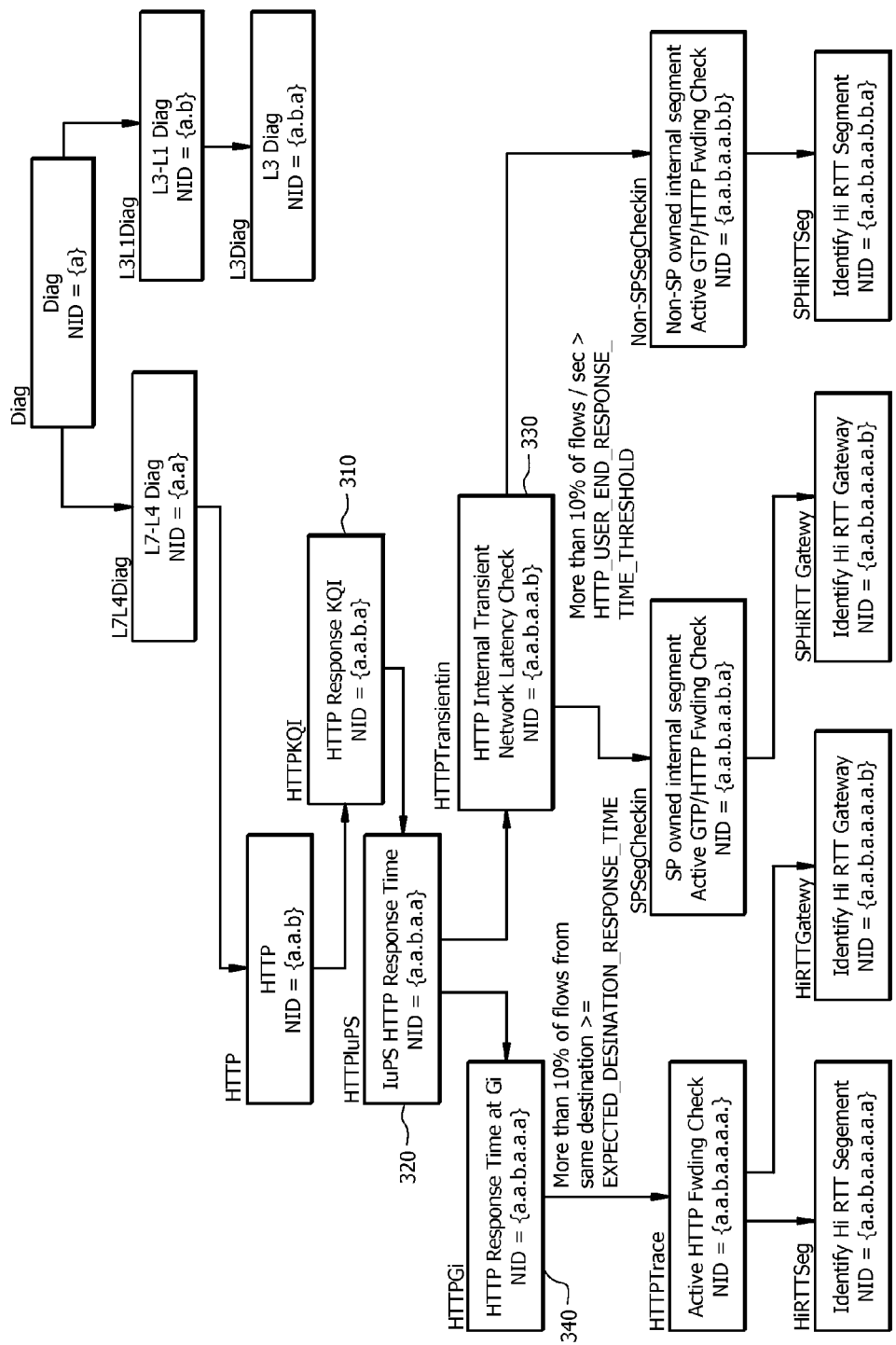
FIG. 3 is a diagram of an analysis model from an analysis design perspective.

FIG. 2 may be considered an engineering design model. FIG. 3 illustrates the same model from an analysis model design perspective. Specifically, FIG. 3 shows an http L7-L1 QoE model hierarchical tree. It can be seen from the figure that the path from the root to one of the analysis nodes is that node's ID. A node's ID may be its key as well. For example, the ID and the key for the HTTPKQI node 310 is {a.a.b.a}. Box 310 in FIG. 3 is equivalent to box 210 in FIG. 2, box 320 in FIG. 3 is equivalent to boxes 220 and 230 in FIG. 2, box 330 in FIG. 3 is equivalent to box 240 in FIG. 2, box 340 in FIG. 3 is equivalent to box 250 in FIG. 2, and so on. The models illustrated in FIG. 2 and FIG. 3 are provided as examples of models that may be generated by the systems and methods disclosed herein. It should be understood that other analysis models may be generated.

FIG. 3 also shows an example of the hierarchal naming described herein. The diagnostic analysis block at the top of FIG. 3 has NID {a}. Each level of analysis block under the diagnostic block has an additional level appended to the NID, and the identifier within each additional level is unique. For example, Layer 7-Layer 4 diagnostic analysis block has NID {a.a} and Layer 3-Layer 1 diagnosis analysis block has NID {a.b}. This pattern is repeated at each additional level of analysis block as shown in FIG. 3. A longest match matching algorithm may be used to index each tree node.

The concept of a model with real time performance will now be considered. The performance of an analysis model may be defined as:

ANALYSIS_MODEL_PERFORMANCE=MAX_CODE_LINES_PER_NODE×MAX_TREE_DEPTH×AVERAGE_EXE_TIME_PER_LINE where ANALYSIS_MODEL_PERFORMANCE is the analysis model performance, MAX_CODE_LINES_PER_NODE is the maximum number lines of code in an analysis node, MAX_TREE_DEPTH is the maximum tree depth, and AVERAGE_EXE_TIME_PER_LINE is the average execution time per line.

Figure 4:
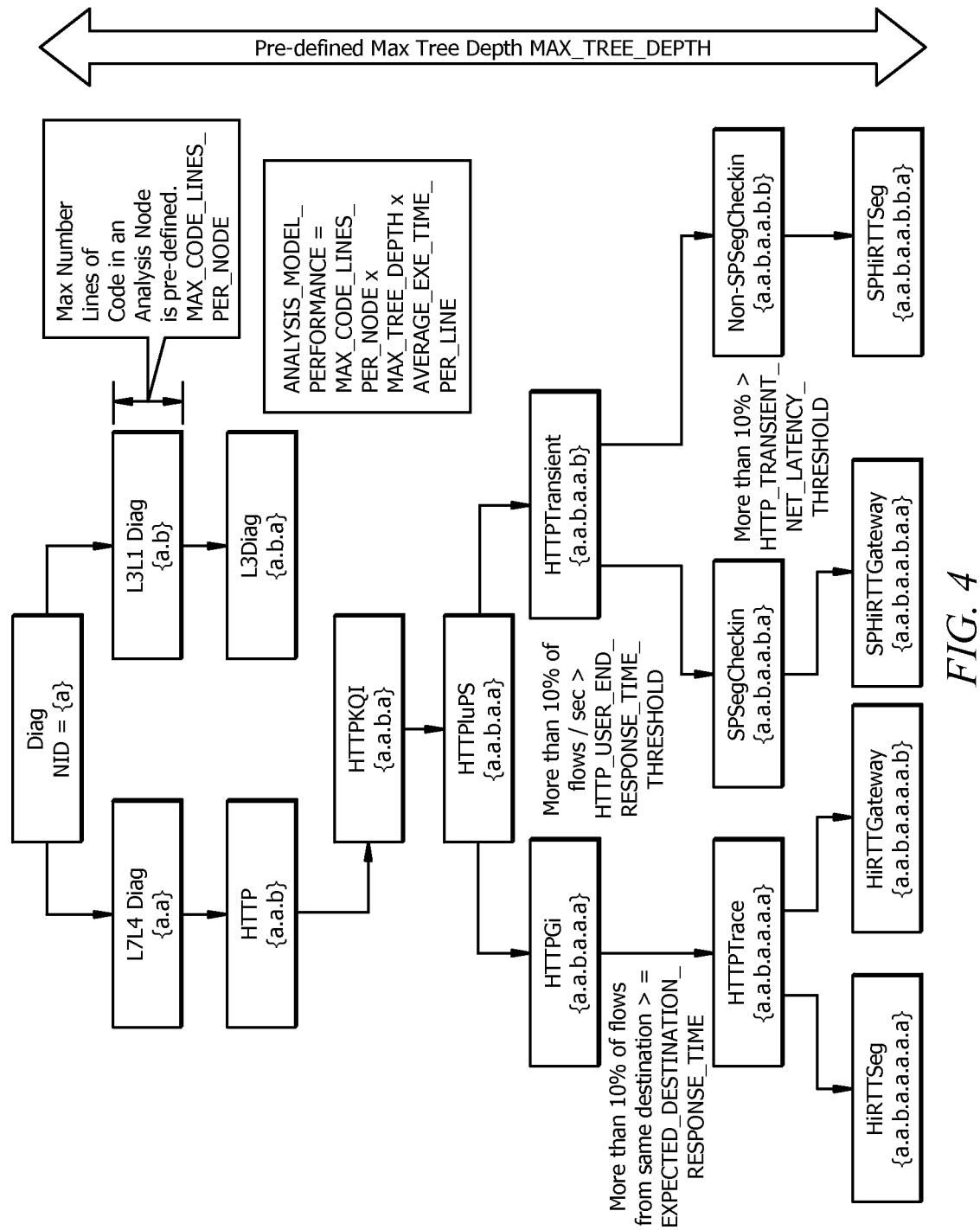
FIG. 4 is a diagram of a calculation of the performance of an analysis model.

To comply with the above constraint, ANALYSIS_MODEL_PERFORMANCE may first be defined to meet a real time performance target, i.e., a predefined execution time. MAX_CODE_LINES_PER_NODE may be pre-defined based on the available analysis blocks, and MAX_TREE_DEPTH may be calculated or defined to meet the analysis model performance. FIG. 4 illustrates these principles.

An analysis node might perform I/O, such as storage I/O and communication I/O. To maintain a measurable performance, the maximum round trip I/O time to a target, MAX_IO_RTT, may be defined for each type of analysis I/O block. An I/O round trip time to a target should not exceed MAX_IO_RTT.

One analysis model may contain multiple sub-trees, and each sub-tree may have multiple branches. Each individual linear execution path may be identified, and execution time along a linear path may be calculated in order to comply with both MAX_TREE_DEPTH and analysis model performance.

An analysis model may be designed based on the execution time constraint and available analysis blocks. During the design, an analysis I/O block may be converted from MAX_IO_RTT to lines of code for convenience of measurement. To verify compliance to the execution time constraint during design, all linear paths and sub-trues may be identified and the total execution time for each linear path may be verified using following formula:

(Total execution time for each Linear Path=(Total lines of code along this Linear Path+Total lines of code converted from analysis I/O blocks)×AVERAGE_EXE_TIME_PER_LINE)<ANALYSIS_MODEL_PERFORMANCE The execution of different sub-trees may be distributed to different dedicated CPU cores to ensure a linear execution performance. The execution process may request a CPU and memory resources from a resource manager and may release the CPU and memory resources back to the resource manager upon completing the execution of a branch or a sub-tree. The minimum CPU and memory resources may be calculated once the design of an analysis model is complete. A CPU resource may be controlled in run time, and memory may be pre-allocated during system initialization by the resource manager. Each of the analysis blocks shown in FIG. 4 may be implemented on a different CPU or core.

Figure 5:
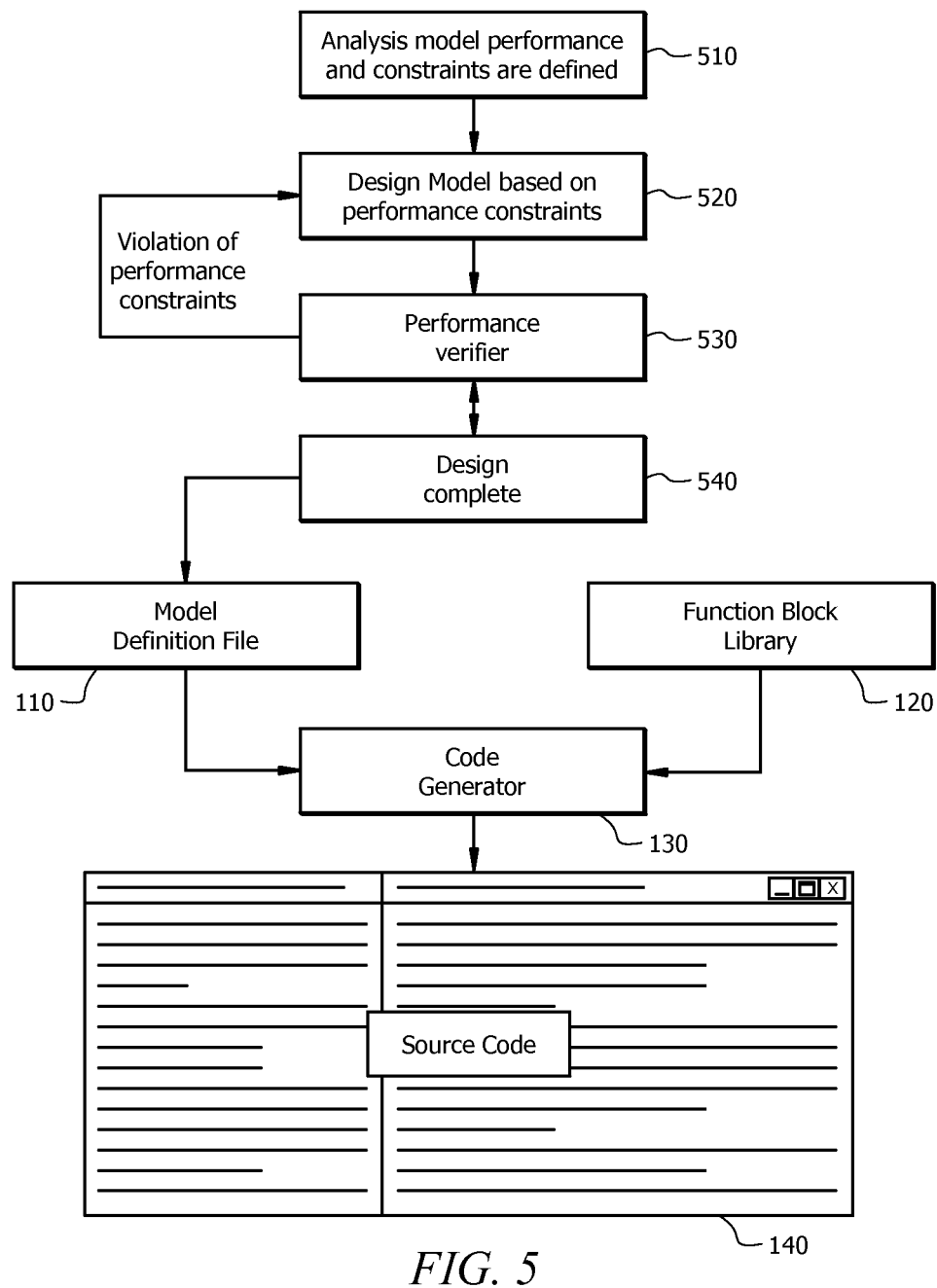
FIG. 5 is a flowchart illustrating analysis model design performance verification.

To achieve automation, constraints may be validated automatically by a performance verifier during the design phase, and adjustments may be made if a violation of a constraint is discovered. FIG. 5 is a flowchart illustrating such performance verification. At block 510, analysis model performance and constraints are defined. At block 520, a design model based on the performance constraints is created or modified. At block 530, the performance of the design model is evaluated by a performance verifier. If the performance of the design model is within the performance constraints then, at box 540, the design may be considered complete. If, at box 530, the performance of the design model is determined to be outside the performance constraints, the flow returns to box 520, and the design model may be modified to satisfy the constraints. The procedures at boxes 520 and 530 may be repeated as often as necessary to generate a design model that meets the performance constraints. When the design is complete at box 540, the model definition file 110, the function block library 120, and the code generator 130 may operate as described with regard to FIG. 1 to generate the source code 140.

Distributed model execution will now be considered. Analysis models may run on a distributed platform that has a flow-based load balancer to distribute data flows to multiple analysis nodes. Based on CPU affinity support in the operating system, each execution process or thread may be bound to one CPU core during system initialization.

Resources may be managed by a central management entity or resource manager that manages and monitors resource utilization and availability. The resource manager may pre-allocate CPU and memory resources during system initialization. When a request of resources is made by an analysis node, the resource manager may grant, retrieve, and/or return a CPU core or memory resource based on the attributes of the target analysis node.

For model execution, an analysis may be started on any CPU core during system initialization by providing an analysis node ID and input data. Upon resources being granted by the resource manager, the first processing node may be retrieved with the node's ID as a key, and processing may be started by executing the first node's analysis functions.

Figure 6:
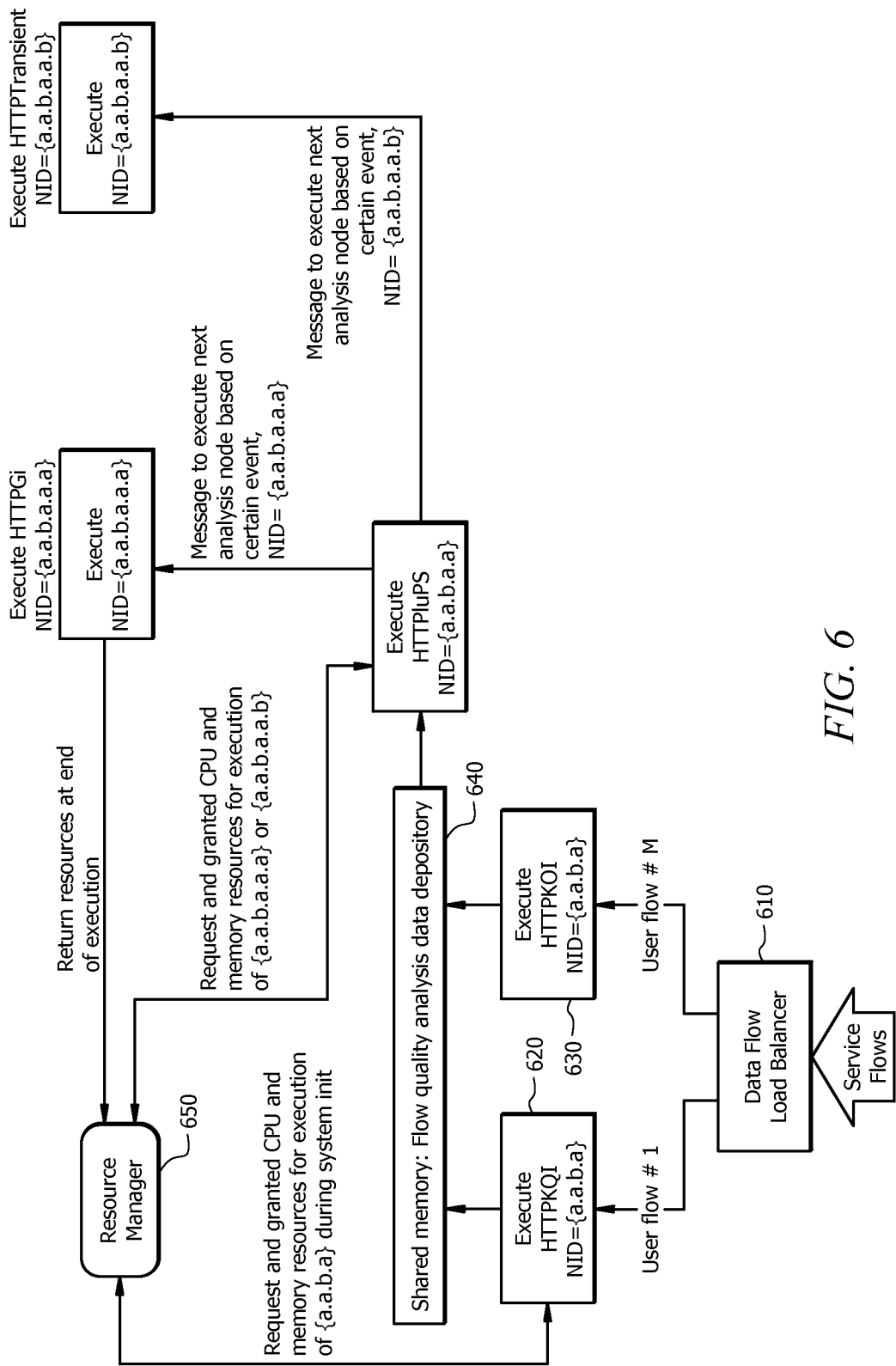
FIG. 6 is a diagram of execution of a distributed model.

FIG. 6 illustrates execution of such a distributed model. A data flow load balancer 610 divides a data flow into two streams, each of which is processed by a different CPU. The first stream flows through analysis block 620, which executes HTTPKQI, and the second stream flows through analysis block 630, which executes HTTPKQI. Analysis blocks 620 and 630 may provide their outputs to a shared memory 640, from which other analysis blocks may access the outputs. A resource manager 650 may receive requests for CPUs and memory from analysis blocks 620 and 630 and the other analysis blocks, may grant the requests, and may receive CPUs and memory returned by the analysis blocks.

An analysis node's function may return five possible values. A first possible value may be the execution status, i.e., either success or failure with a cause. If the status is failure, the analysis may stop and an error condition may be reported. A second possible value may be execution result data, which may be the input for the processing of the next node. A third possible value may be the execution state for choosing the next processing node, i.e., the state machine result, if the node's state machine is defined, the analysis may directly jump to the next node and execute the next node's function. A fourth possible value may be the next processing node's ID so that a jump to another sub-tree may occur and execution of that sub-tree may take place on another CPU core. In this case, the processing may start from the first step again. In the fifth case, if no more processing is needed and the analysis is complete, the result of the analysis may be returned. In this case, the state machine's next node may not be specified and the next processing node's ID may be empty.

The execution of a linear path in an analysis model may be transitioned from one CPU core to another. When a CPU core transition is defined in a model, the current analysis node may request a CPU and memory resources from the resource manager based on the next analysis node's attributes. The resource manager may grant a CPU core and memory resources to the next node. A message that carries node ID, resource, and input data may be sent to the target process or thread running on the granted CPU core to start execution of the next analysis node. At the end of the execution, the last analysis node may return resources back to the resource manager.

Analysis nodes belonging to a model may be executed across multiple devices. In such cases, a master resource manager may be assigned to manage overall resources. The resource manager at each device may manage local resources and report resource status to the master resource manager. The master resource manager may be responsible for resource granting and for handling resource returns. Resource requests, grants, and returns may go through a remote shared memory.

Figure 7:
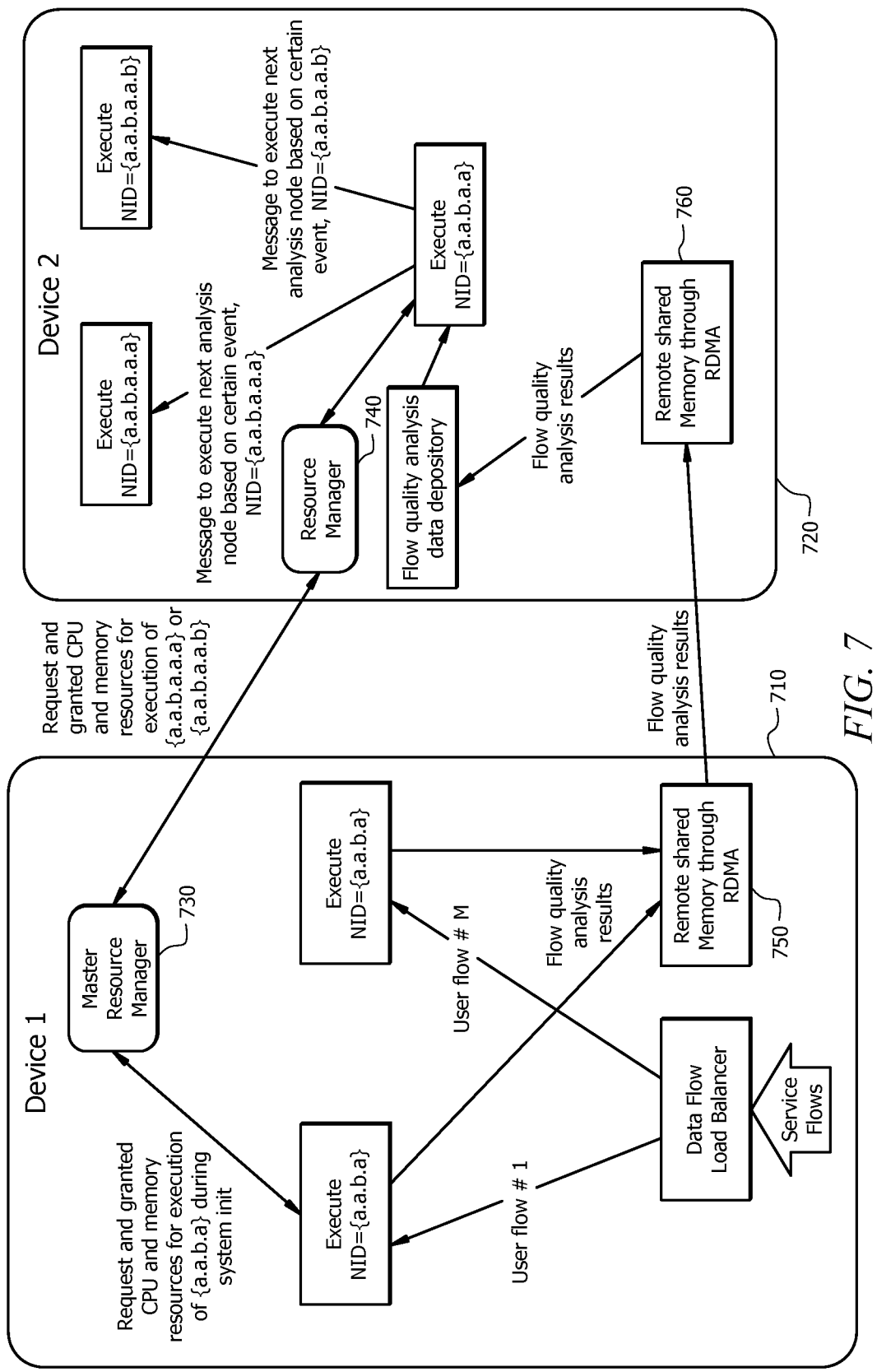
FIG. 7 is a diagram of execution of a distributed model across multiple devices.

FIG. 7 illustrates such execution of a distributed model across multiple devices. A first device 710 and a second device 720 may each execute analysis blocks as described above. In addition, resource requests and grants may be made between the devices 710 and 720, and data may be shared between the devices 710 and 720. The first device 710 includes a master resource manager 730, which may receive CPU and memory requests from a local resource manager 740 in the second device 720 and may grant CPU and memory resources to the local resource manager 740 in the second device 720. In addition, data stored in a remote direct memory access (RDMA) component 750 in the first device 710 may be shared with an RDMA component 760 in the second device 720.

Figure 8:
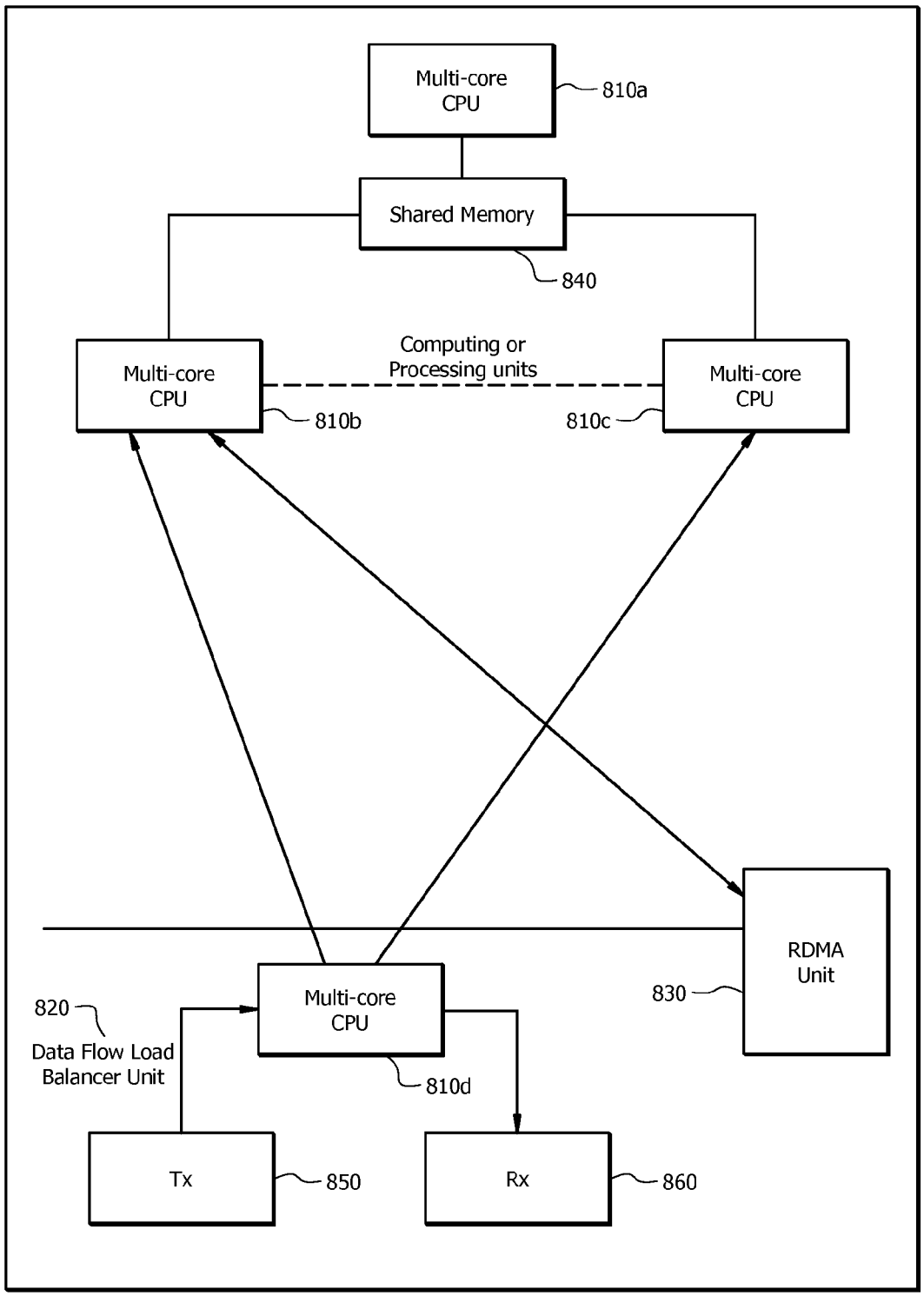
FIG. 8 is a diagram of a hardware design.

FIG. 8 illustrates a hardware design for a component that may be used to implement the systems and methods disclosed herein. Software and/or firmware may additionally or alternatively be used in implementing the disclosed systems and methods but are not shown in the figure. The computing or processing described herein may be performed on one or more multi-core CPUs 810. A data flow load balancer unit 820 may use one or more cores from one of the multi-core CPUs 810 or may use an independent multi-core CPU. Flow quality analysis results may be shared through an RDMA unit 830, which may be implemented in software, firmware, or hardware. A shared memory unit 840 may be a double data rate type three (DDR3) unit or a similar unit and may be shared among some or all of the multi-core CPUs 810. A transmitter unit 850 and a receiver unit 860 may support multiple types of media and multiple frame types, such as Ethernet, Asynchronous Transfer Mode (ATM), or frame relay.

An advantage of the systems and methods disclosed herein over existing methods may be the fact that the present method is an object-oriented model design methodology. That is, analysis blocks and functions are reusable, which may save development time. Also, code may be automatically generated, which may lead to faster development time and better software quality. Another advantage is that real time performance within a model with specific performance requirements is provided. Another advantage is guaranteed performance. That is, service quality may be improved in real time when the disclosed systems are used in network problem diagnostics, operating expenses may be reduced, and customer experience may be improved. Yet another advantage is that dynamic, distributed model execution may occur across multiple devices, fully utilizing system resources in an optimal way. This may lead to a better investment return and may allow resources to be provisioned ahead of time along with other applications to fully utilize available resources. Still another advantage is software and hardware integration, which can provide higher performance delivery.

Figure 9:
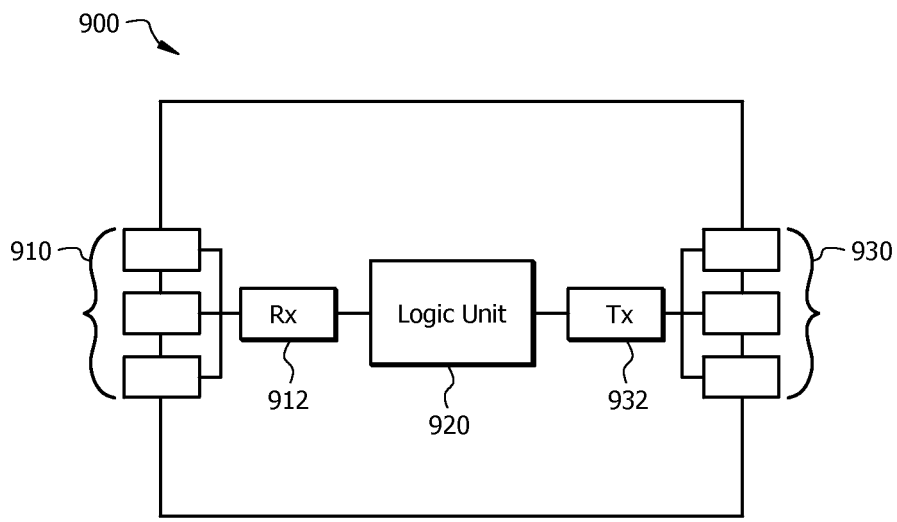
FIG. 9 is a schematic diagram of a network component.

At least some of the features/methods described in the disclosure may be implemented in a network apparatus or component, such as a network node or unit. For instance, the features/methods of the disclosure may be implemented using hardware, firmware, and /or software installed to run on hardware. The network apparatus/component or unit may be any device that transports frames through a network, e.g., a switch, router, bridge, server, etc. FIG. 9 illustrates an embodiment of a transmitter/receiver unit 900, in which the disclosed methods and systems may be implemented. The transmitter/receiver unit 900 may be any device that transports data through the network. The network unit 900 may comprise one or more ingress ports or units 910 coupled to a receiver (Rx) 912 for receiving signals and frames/data from other network components. The network unit 900 may comprise a logic unit 920 to determine which network components to send data to. The logic unit 920 may be implemented using hardware, software, or both. The network unit 900 may also comprise one or more egress ports or units 930 coupled to a transmitter (Tx) 932 for transmitting signals and frames/data to the other network components. The receiver 912, logic unit 920, and transmitter 932 may also implement or support the composite link architecture, system, and method described above. The components of the network unit 900 may be arranged as shown in FIG. 9.

Figure 10:
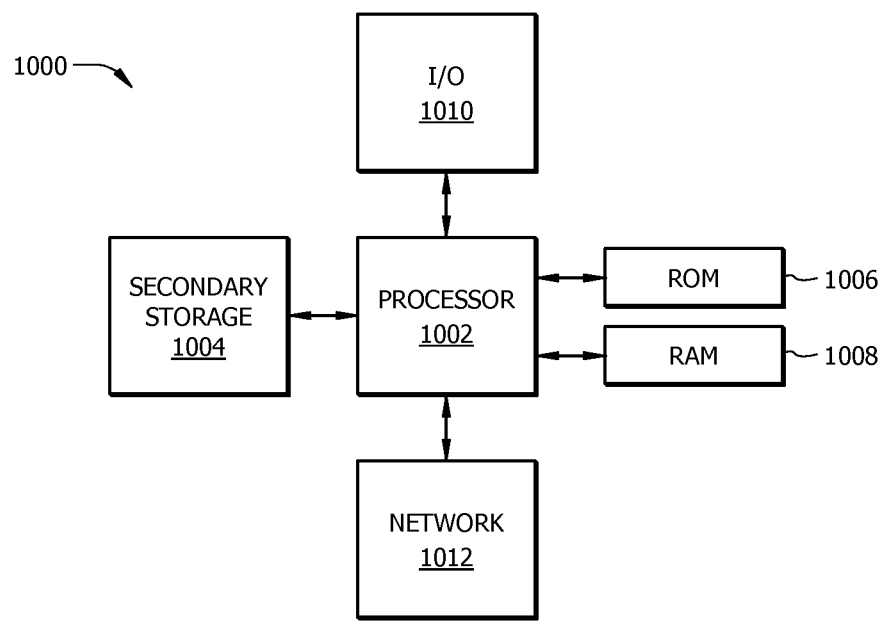
FIG. 10 is a schematic diagram of a computer system.

The schemes described above may be implemented on a network component, such as a computer or network component with sufficient processing power, memory resources, and network throughput capability to handle the necessary workload placed upon it. FIG. 10 illustrates an embodiment of a network component or computer system 1000 suitable for implementing one or more embodiments of the methods disclosed herein. The network component or computer system 1000 includes a processor 1002 that is in communication with memory devices including secondary storage 1004, read only memory (ROM) 1006, random access memory (RAM) 1008, input/output (I/O) devices 1010, and transmitter/receiver 1012. Although illustrated as a single processor, the processor 1002 is not so limited and may comprise multiple processors. The processor 1002 may be implemented as one or more general purpose central processor unit (CPU) chips, cores (e.g., a multi-core, processor), field-programmable gate arrays (FPGAs), application specific integrated circuits (ASICs), and/or digital signal processors (DSPs), and/or may be part of one or more ASICs. The processor 1002 may be configured to implement any of the schemes described herein. The processor 1002 may be implemented using hardware or a combination of hardware and software.

The secondary storage 1004 is typically comprised of one or more disk drives or tape drives and is used for non-volatile storage of data and as an over-flow data storage device if the RAM 1008 is not large enough to hold all working data. The secondary storage 1004 may be used to store programs that are loaded into the RAM 1008 when such programs are selected for execution. The ROM 1006 is used to store instructions and perhaps data that are read during program execution. The ROM 1006 is a non-volatile memory device that typically has a small memory capacity relative to the larger memory capacity of the secondary storage 1004. The RAM 1008 is used to store volatile data and perhaps to store instructions. Access to both the ROM 1006 and the RAM 1006 is typically faster than to the secondary storage 1004.

The transmitter/receiver 1012 may serve as an output and/or input device of the computer system 1000. For example, if the transmitter/receiver 1012 is acting as a transmitter, it may transmit data out of the computer system 1000. If the transmitter/receiver 1012 is acting as a receiver, it may receive data into the computer system 1000. The transmitter/receiver 1012 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (WiMAX), and/or other air interface protocol radio transceiver cards, and other well-known network devices. The transmitter/receiver 1012 may enable the processor 1002 to communicate with an Internet or one or more intranets. I/O devices 1010 may include a video monitor, liquid crystal display (LCD), touch screen display, or other type of video display for displaying video, and may also include a video recording device for capturing video. I/O devices 1010 may also include one or more keyboards, mice, or track balls, or other well-known input devices.

It is understood that by programming and/or loading executable instructions onto the computer system 1000, at least one of the processor 1002, the secondary, storage 1004, the RAM 1008, and the ROM 1006 are changed, transforming the computer system 1000 in part into a particular machine or apparatus (e.g., a video codec having the novel functionality taught by the present disclosure). The executable instructions may be stored on the secondary storage 1004, the ROM 1006, and/or the RAM 1008 and loaded into the processor 1002 for execution. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an ASIC, because for large production runs the hardware implementation may be less expensive than the software implementation. Often a design may he developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc,; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: $R=Rl+k*(Ru-Rl)$, wherein k is a variable ranging from 1 percent to 100 percent with a 1 percent increment, i.e., k is 1 percent, 2 percent, 3 percent, 4 percent, 5 percent, . . . , 70 percent, 71 percent, 72 percent, . . . , 95 percent, 96 percent, 97 percent, 98 percent, 99 percent, or 100 percent. Moreover, any numerical range defined by two R numbers as defined in the above is also specifically disclosed. The use of the term about means±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may he omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A system for generating a network analysis model comprising:
   a memory comprising:
      a text-based model definition file representing analysis flow and a hierarchical analysis tree for the network analysis model; and
      an analysis function block library comprising a plurality of analysis nodes in an analysis model definition, wherein each of the analysis nodes comprises at least one object-oriented reusable analysis block, and wherein the analysis nodes are unified analysis nodes organized as a hierarchical tree;
   a processor coupled to the memory and configured to:
      provide performance constraints for the network analysis model; and
      verify that performance of the network analysis model satisfies the performance constraints, wherein the performance of the network analysis model is based on a number of analysis nodes per analysis path of the hierarchical analysis tree, a number of code lines per analysis node, and an average execution time per line of code;
   a code generator configured to automatically generate code to implement the network analysis model from the analysis function block library by parsing the text-based model definition file.

2. The system of claim 1, wherein each analysis node is identified by a unique node identifier (ID), wherein the node ID is a string-based ID using character sets from a to z, 1 to 9, and A to Z, wherein the node ID's path from a root to the analysis node is the analysis node's ID as well as an analysis node key, wherein a maximum key length is a depth of the hierarchical analysis tree, and wherein each analysis node is associated with a set of attributes including execution time and a memory requirement.

3. The system of claim 1, wherein each analysis block is associated with a set of attributes including lines of code, average execution time for one line of code on predefined hardware, a memory requirement, and access to an input/output (I/O) component, and wherein each type of I/O is implemented in a different analysis block dedicated for I/O.

4. The system of claim 1, wherein a generic state machine is used to drive the hierarchical analysis tree to dynamically choose a next analysis node, wherein tree creation is performed by auto-generated initialization functions during startup of the network analysis model, and wherein a processing entry point uses a first analysis node's node ID to locate the first analysis node and starts processing from the first analysis node.

5. The system of claim 4, wherein a direct jump from one analysis node to another analysis node is allowed.

6. The system of claim 1, wherein each node of the unified analysis nodes has a predefined number of lines of code.

7. An apparatus for executing a network analysis model comprising:
   a processor; and
   a memory coupled to the processor, wherein the memory comprises instructions that cause the processor to:
      provide performance constraints for the network analysis model;
      execute the network analysis model on a distributed platform, wherein the distributed platform includes a flow-based load balancer to distribute data flow to multiple analysis nodes, wherein the analysis nodes are unified analysis nodes organized as a hierarchical tree, and wherein the unified analysis nodes comprise one or more object-oriented reusable analysis blocks; and
      verify that performance of the network analysis model satisfies the performance constraints, wherein the performance of the network analysis model is based on a number of analysis nodes per analysis path of a hierarchical analysis tree, a number of code lines per analysis node, and an average execution time per line of code.

8. The apparatus of claim 7, wherein one execution process is bound to one processor core during initialization of the network analysis model based on affinity support for the processor in an operating system associated with the processor.

9. The apparatus of claim 7, wherein an analysis node returns a value indicating at least one of:
   an execution status indicating either success or failure with cause, wherein analysis is stopped and an error condition is reported if the execution status is failure;
   an execution result usable as an input for processing by a succeeding node;
   an execution state for choosing the succeeding node, wherein analysis jumps directly to the succeeding node and the succeeding node's function is executed if a state machine is defined for the analysis node;
   an identifier (ID) for a next processing node, wherein the ID indicates that processing is to jump to another sub-tree and that the other sub-tree is to be executed on another processor core; and
   a result of a network analysis in a case where processing is complete and the network analysis is complete, wherein a state machine for the next analysis node is not specified and the next processing node's ID is empty.

10. The apparatus of claim 7, wherein resources for executing the network analysis model are managed by a resource manager, and wherein the resource manager performs at least one of:
   pre-allocating processor and memory resources during initialization of the network analysis model;
   granting a processor core or memory resource based on attributes of an analysis node;
   retrieving and returning the processor core or memory resource; and
   managing and monitoring resource utilization and availability.

11. The apparatus of claim 10, wherein a network analysis is started on any of a plurality of processor cores during initialization of the network analysis model by provision of an analysis node identifier (ID) and input data, and wherein a first processing node is retrieved with a starting analysis node's ID as a key and the processing is started by executing analysis functions of the starting analysis node upon a resource being granted by the resource manager.

12. The apparatus of claim 10, wherein a current analysis node requests the processor and memory resources from the resource manager based on a next analysis node's attributes when a processor core transition is defined in the network analysis model, wherein the resource manager grants the processor core and memory resources to the next node, wherein a message that carries node identifier (ID), resource, and input data is sent to a target process running on the granted processor core, the message indicating to start execution of the next analysis node, and wherein a last analysis node returns the resources to the resource manager at an end of execution.

13. The apparatus of claim 7, wherein network analysis models are executed across multiple devices, wherein a master resource manager is assigned to manage overall resources and is responsible for granting resources and handling resource return, wherein a resource manager at each device manages resources for its associated device and reports resource status to the master resource manager, and wherein resource requests, grants, and returns pass through a remote shared memory.

14. The apparatus of claim 7, wherein the unified analysis nodes each have a predefined number of lines of code.

* * * * *